(12) United States Patent
Lien et al.

(10) Patent No.: US 8,256,106 B2
(45) Date of Patent: Sep. 4, 2012

(54) METHOD FOR FABRICATING CIRCUIT BOARD STRUCTURE WITH CAPACITORS EMBEDDED THEREIN

(75) Inventors: Chung-Cheng Lien, Hsinchu (TW); Chih-Kui Yang, Hsinchu (TW)

(73) Assignee: Unimicron Technology Corp. (TW)

( * ) Notice: Subject to any disclaimer, the term of this patent is extended or adjusted under 35 U.S.C. 154(b) by 975 days.

(21) Appl. No.: 12/010,345

(22) Filed: Jan. 24, 2008

(65) Prior Publication Data
US 2008/0210460 A1 Sep. 4, 2008

(30) Foreign Application Priority Data

Jan. 25, 2007 (TW) ................................ 96102784 A

(51) Int. Cl.
- H05K 1/16 (2006.01)
- H05K 3/02 (2006.01)
- H05K 3/32 (2006.01)
- H05K 3/42 (2006.01)
- H05K 3/46 (2006.01)

(52) U.S. Cl. ................ 29/830; 29/832; 29/846; 29/847; 29/852; 174/260

(58) Field of Classification Search ................ 29/830, 29/831, 832, 841, 846, 847, 852; 174/260
See application file for complete search history.

(56) References Cited

U.S. PATENT DOCUMENTS

| | | | |
|---|---|---|---|
| 6,734,542 B2* | 5/2004 | Nakatani et al. | 257/687 |
| 7,100,276 B2* | 9/2006 | Fukuoka et al. | 29/830 |
| 7,394,663 B2* | 7/2008 | Yamashita et al. | 361/766 |
| 2004/0231885 A1* | 11/2004 | Borland et al. | 174/260 |

* cited by examiner

Primary Examiner — Livius R Cazan
(74) Attorney, Agent, or Firm — Bacon & Thomas, PLLC

(57) ABSTRACT

A circuit board structure with capacitors embedded therein and a method for fabricating the same are disclosed. The structure comprises at least two core layers individually comprising a dielectric layer having two opposite surfaces, circuit layers disposed on the outsides of the two opposite surfaces of the dielectric layer, and at least two capacitors embedded respectively on the insides of the two opposite surfaces of the dielectric layer and individually electrically connecting with the circuit layer at the same side; at least one adhesive layer disposed between the core layers to combine the core layers as a core structure; and at least one conductive through hole penetrating the core layers and the adhesive layer, and electrically connecting the circuit layers of the core layers. Accordingly, the present invention can improve the flexibility of circuit layout, and realize parallel connection between the capacitors to provide more capacitance.

5 Claims, 7 Drawing Sheets

METHOD FOR FABRICATING CIRCUIT BOARD STRUCTURE WITH CAPACITORS EMBEDDED THEREIN

BACKGROUND OF THE INVENTION

1. Field of the Invention

The present invention relates to a circuit board structure with capacitors embedded therein and a method for fabricating the same and, more particularly, to a circuit board structure with capacitors embedded therein and a method for fabricating the same, which can improve the flexibility of circuit layout.

2. Description of Related Art

Currently, the relentless progress in semiconductor fabricating process and electronic functions of microelectronic devices has lead to a highly integrated development of semiconductor chips. Quantity of input/output terminals and density of wiring in package structures increase as semiconductor chips develop toward high integration. However, as the density of wiring in a package structure increases, the noise also increases. Generally, in order to obviate noise or compensate electricity, passive components, e.g. resistors, capacitors, and inductors, are installed in a semiconductor chip package structure to eliminate noise and to stabilize circuits to thereby meet the requirements of microelectronic devices.

In conventional methods, utilizing surface mount technology (SMT) integrates most passive components onto a surface of a packaging substrate, such that the flexibility of wiring layout on the surface is restricted, and the occupied space is unfavorable to shrinkage of package size.

In view of the aforementioned drawbacks, many studies relative to lamination methods have appeared in recent years. High dielectric constant material is laminated between two copper layers and then electrode plates and circuits are formed to fabricate capacitors. FIG. 1 shows a perspective view of a packaging substrate structure laminated with capacitors, wherein the process thereof comprises: providing a core substrate 10 having an inner circuit layer 11 having an inner electrode plate 111; and forming a high dielectric constant material layer 12 on the inner circuit layer 11, and forming an outer circuit layer 13 having a plurality of conductive pads 132 and an outer electrode plate 131 on the high dielectric constant material layer 12 to thereby make a capacitor 17 through the outer electrode plate 131, the inner electrode plate 111, and a part of the high dielectric constant material layer 12 therebetween. The inner circuit layer 11 and the outer circuit layer 13 as well as the circuits on two sides of the substrate are electro-connected by plated through holes (PTH) 14. In addition, a solder mask 15 is formed on the surfaces of the above structure, wherein the solder mask 15 has a plurality of openings 151 to expose the conductive pads 132 thereby accomplishing the packaging substrate.

However, the prior art forms a whole piece of high dielectric constant material layer within a packaging substrate, wherein the used part of the high dielectric constant material layer for a capacitor is merely the one between the inner electrode plate and the outer electrode plate, while the unused part of the high dielectric constant material layer electrically contacts with the circuits, such that the structure has several drawbacks: first, the unused part of the high dielectric constant material layer causes waste, unfavorable to reducing the cost; second, owing to the poor fluidity of the high dielectric constant material, voids and poor uniformity of thickness occur; third, the unused part of the high dielectric constant material layer contacts the circuits, so that parasitic capacitance occurs to interfere with electrical qualities; finally, because the electrode plates and the circuits are laid together in a circuit layer, the flexibility of layouts of both the electrode plates and the circuits is compromised.

In addition, another conventional process has been developed. As shown in FIG. 2A, a metal layer 21 is provided; a high dielectric constant material layer 22 and another metal layer 23 are formed on part of the metal layer 21; and then a dielectric layer 24 is formed on the metal layer 21 to accomplish a carrier 2 with capacitors embedded therein. Subsequently, as shown in FIG. 2B, a core board 2' comprising a dielectric layer 25 and circuit layers 26 on two surfaces of the dielectric layer 25 is provided; the core board 2' is laminated between two carriers 2; the carriers 2 are drilled and the metal layer 21 is patterned to form a circuit layer 271 and conductive vias 272 so as to obtain a circuit board structure with capacitors embedded therein, as shown in FIG. 2C. In comparison to the prior art shown in FIG. 1, the prior art shown in FIGS. 2A to 2C does not use a whole piece of high dielectric constant material layer and thereby can avoid the drawbacks: the unused part of the high dielectric constant material layer causes waste, unfavorable to reducing the cost; the manufacture for capacitors of high quality is difficult; and parasitic capacitance occurs to interfere with electrical qualities. However, in the structure, the electrode plates and the circuits are still laid together in a circuit layer, such that the flexibility of layouts of both the electrode plates and the circuits is compromised, and parallel connection between the capacitors to provide more capacitance cannot be achieved.

Therefore, it is desirable to provide an improved circuit board structure with capacitors embedded therein and fabricating method thereof to mitigate and/or obviate the aforementioned drawbacks.

SUMMARY OF THE INVENTION

In view of the above prior art disadvantages, the object of the present invention is to provide a circuit board structure with capacitors embedded therein and fabricating method thereof, whereby advanced flexibility of layouts of both the electrode plates and the circuits on the circuit board and parallel connection between the capacitors to provide more capacitance are achieved.

To achieve the above object, the present invention provides a circuit board structure with capacitors embedded therein, comprising: at least two core layers individually comprising a dielectric layer having two opposite surfaces, circuit layers disposed on the outsides of the two opposite surfaces of the dielectric layer, and at least two capacitors embedded respectively on the insides of the two opposite surfaces of the dielectric layer and individually electrically connecting with the circuit layer at the same side; at least one adhesive layer disposed between the core layers to combine the core layers as a core structure; and at least one conductive through hole penetrating the core layers and the adhesive layer, and electrically connecting the circuit layers of the core layers.

The present invention further provides a method for fabricating a circuit board structure with capacitors embedded therein, comprising: providing two core layers individually comprising a dielectric layer having two opposite surfaces, first metal layers disposed on the outsides of the opposite surfaces of the dielectric layer, and at least two capacitors embedded respectively on the insides of the opposite surfaces of the dielectric layer and individually electrically connecting with the first metal layer at the same side; patterning the first metal layer on one surface of each core layer to form a circuit layer; laminating an adhesive layer between the surfaces each having the circuit layer of the core layers to combine the core layers as a core structure; and patterning the first metal layers on the outsides of two opposite surfaces of the core structure to form circuit layers, and forming at least one conductive through hole penetrating the core layers and the adhesive layer, wherein the conductive through hole electrically connects the circuit layers of the core layers.

The aforementioned method can further comprise: providing at least another core layer. The two opposite surfaces of the core layer individually have a circuit layer formed thereon, and the core layer is sandwiched in and laminated between the aforementioned two core layers by an adhesive layer to form a core structure.

The aforementioned structure and method can further comprise built-up structures disposed/formed on the two sides of the core structure. The built-up structures individually comprise at least one dielectric layer, at least one circuit layer, a plurality of conductive vias, and a plurality of conductive pads. Parts of the conductive pads electrically connect to the circuit layers on the two sides of the core structure, respectively. The built-up structures can further individually comprise a solder mask having a plurality of openings to expose the conductive pads.

The present invention further provides another circuit board structure with capacitors embedded therein, comprising: a first core layer comprising a dielectric layer having two opposite surfaces, circuit layers disposed on the outsides of the two opposite surfaces of the dielectric layer, and at least two capacitors embedded respectively on the insides of the two opposite surfaces of the dielectric layer and individually electrically connecting with the circuit layer at the same side; and a second core layer and a third core layer disposed respectively on the two sides of the first core layer to form a core structure, wherein the second core layer and the third core layer individually comprise a dielectric layer, a circuit layer disposed on the outer surface of the dielectric layer, and at least one capacitor embedded on the inside of the outer surface of the dielectric layer and electrically connecting with the circuit layer.

The aforementioned structure can further comprise at least one first conductive through hole penetrating the first, the second, and the third core layers to electrically connect the circuit layers of the first, the second, and the third core layers. Alternatively, the aforementioned structure can further comprise at least one second conductive through hole penetrating the first core layer to electrically connect the circuit layers on the two sides of the first core layer; and a plurality of conductive vias disposed in the dielectric layers of the second core layer and the third core layer to electrically connect the circuit layers of the second core layer and the third core layer with the circuit layers on the two sides of the first core layer, respectively.

The present invention further provides a method for fabricating a circuit board structure with capacitors embedded therein, comprising: providing a first core layer comprising a dielectric layer having two opposite surfaces, first metal layers disposed on the outsides of the two opposite surfaces of the dielectric layer, and at least two capacitors embedded respectively on the insides of the two opposite surfaces of the dielectric layer and individually electrically connecting with the first metal layer at the same side; providing a second core layer and a third core layer individually comprising a dielectric layer, a first metal layer disposed on one surface of the dielectric layer, and at least one capacitor embedded on the inside of the surface with the first metal layer disposed on the outside thereof of the dielectric layer, and electrically connecting with the first metal layer; patterning the first metal layers of the first core layer to form circuit layers; laminating the two surfaces of the first core layer with the dielectric layers of the second core layer and the third core layer, respectively, to form a core structure; and patterning the first metal layers of the second core layer and the third core layer to form circuit layers.

The aforementioned method can further comprise: forming a first conductive through hole penetrating the first, the second, and the third core layers to electrically connect the circuit layers of the first, the second, and the third core layers, while forming the circuit layers of the second core layer and the third core layer. Alternatively, the aforementioned method can further comprise: forming a second conductive through hole penetrating the first core layer to electrically connect the circuit layers on the two sides of the first core layer, while forming the circuit layers on the two opposite surfaces of the first core layer; and forming a plurality of conductive vias in the dielectric layers of the second core layer and the third core layer to electrically connect the circuit layers of the second core layer and the third core layer with the circuit layers on the two sides of the first core layer, respectively, while forming the circuit layers of the second core layer and the third core layer.

The aforementioned structure and method can further comprise built-up structures disposed/formed on the two sides of the core structure. The built-up structures individually comprise at least one dielectric layer, at least one circuit layer, a plurality of conductive vias, and a plurality of conductive pads. Parts of the conductive pads electrically connect to the circuit layers of the second core layer and the third core layer, respectively. The built-up structures can further individually comprise a solder mask having a plurality of openings to expose the conductive pads.

In the circuit board structure with capacitors embedded therein according to the present invention, each of the capacitors comprises: a first electrode plate disposed on the outside of one surface of the dielectric layer, and electrically connecting with the circuit layer at the same side; a high dielectric constant material layer embedded on the inside of the surface with the first electrode plate disposed on the outside thereof of the dielectric layer and plastering the first electrode plate; and a second electrode plate disposed in the inner space of the dielectric layer, plastered with the high dielectric constant material layer, parallel with the first electrode plate, and electrically connecting to the circuit layer but not to the first electrode plate.

Accordingly, the present invention can improve the flexibility of circuit layout, realize parallel connection between the capacitors to provide more capacitance, efficiently enhance the utilization ratio of inner space of the circuit board, and thereby achieve the purpose of miniaturization.

Other objects, advantages, and novel features of the invention will become more apparent from the following detailed description when taken in conjunction with the accompanying drawings.

DETAILED DESCRIPTION OF THE PREFERRED EMBODIMENT

Method Embodiment 1

Figure 1:
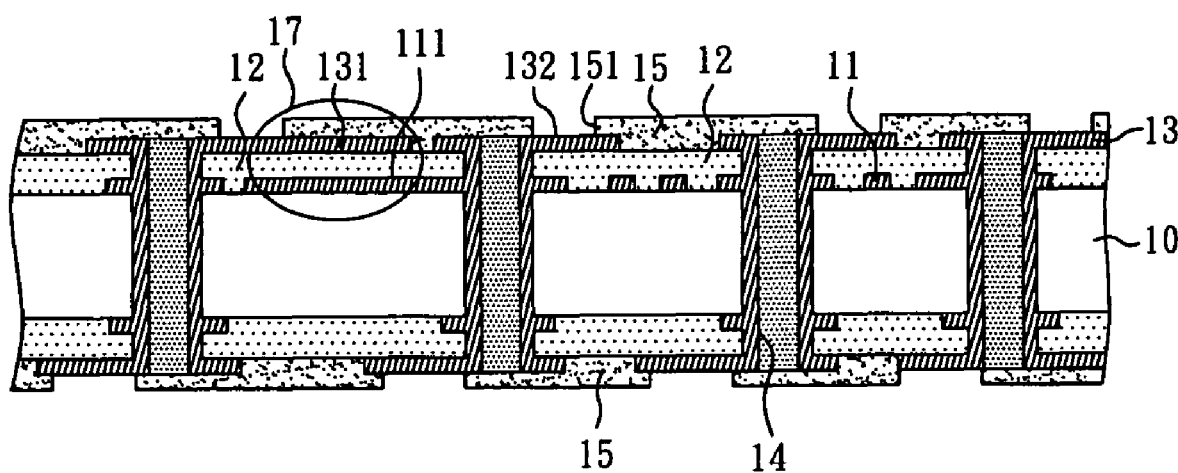
FIG. 1 is a cross-section view of a conventional circuit board structure with capacitors.
Figure 2A:
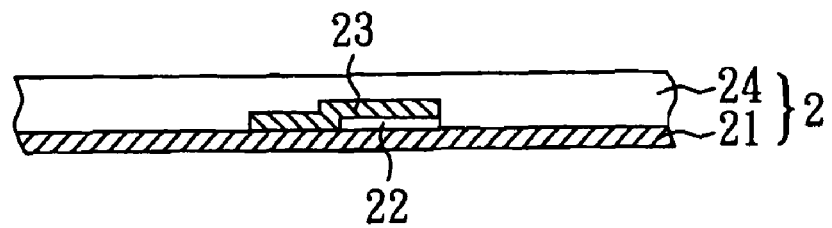
FIGS. 2A to 2C are cross-section views of a conventional process for fabricating a circuit board structure with capacitors embedded therein.
Figure 2B:
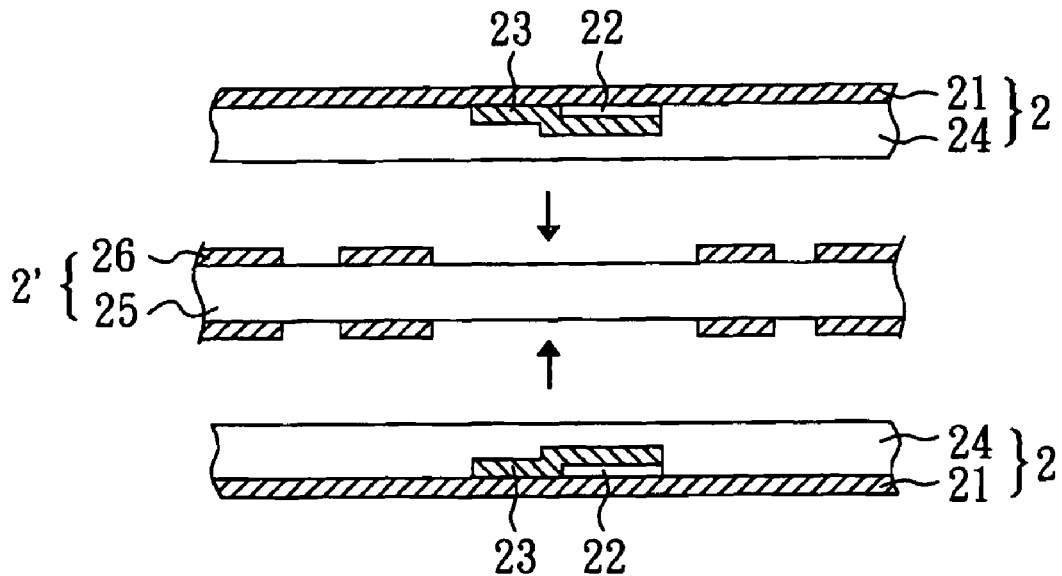
Figure 2C:
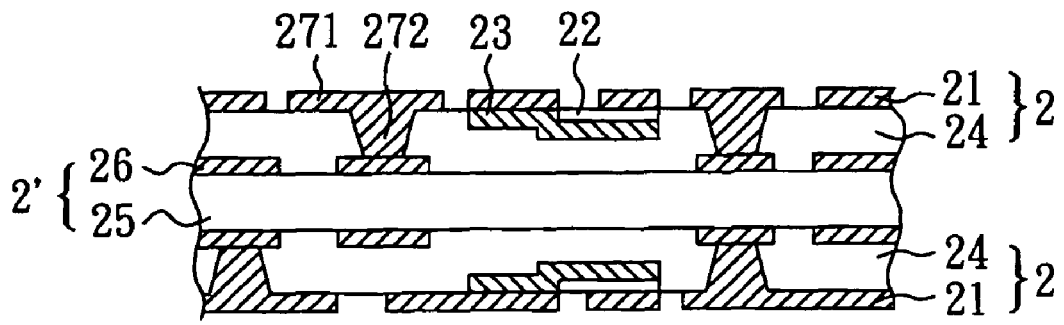
Figure 3A:
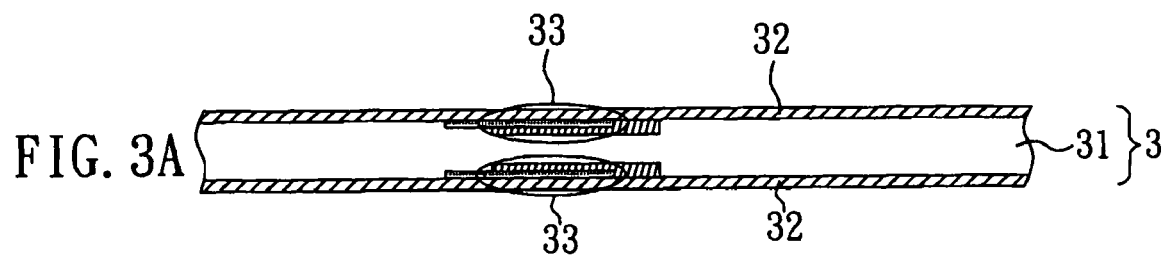
FIGS. 3A to 3E are cross-section views of a process for Method Embodiment 1 of the present invention.

With reference to FIGS. 3A to 3D, there are shown cross-section views of a process for fabricating a circuit board structure with capacitors embedded therein. As shown in FIG. 3A, at least two core layers 3,3 are provided. In the present embodiment, three core layers 3, 3', and 3 are provided, and the core layers 3, 3' and 3 individually comprise a dielectric layer 31. The material of the dielectric layer 31 can be selected from the group consisting of a non-photosensitive organic resin, a photosensitive organic resin (e.g. ABF (Ajinomoto Build-up Film), BCB (Benzocyclo-buthene), LCP (Liquid Crystal Polymer), PI (Poly-imide), PPE (Poly(phenylene ether)), PTFE (Poly(tetra-fluoroethylene)), FR4, FR5, BT (Bismaleimide Triazine), or Aramide), and a mixture of epoxy resin and fiber glass. In the present embodiment, the material of the dielectric layer 31 is ABF. The dielectric layer 31 has two opposite surfaces, and the outsides of the two opposite surfaces individually have a first metal layer 32 thereon. The material of the first metal layer 32 can be selected from the group consisting of copper, tin, nickel, chromium, titanium, a copper/chromium alloy, and a tin/lead alloy. In the present embodiment, the material of the first metal layer 32 is copper. The core layers 3, 3' and 3 individually further comprise at least two capacitors 33 embedded respectively on the insides of the two opposite surfaces of the dielectric layer 31 and individually electrically connecting to the first metal layer 32 at the same side.

Figure 3B:
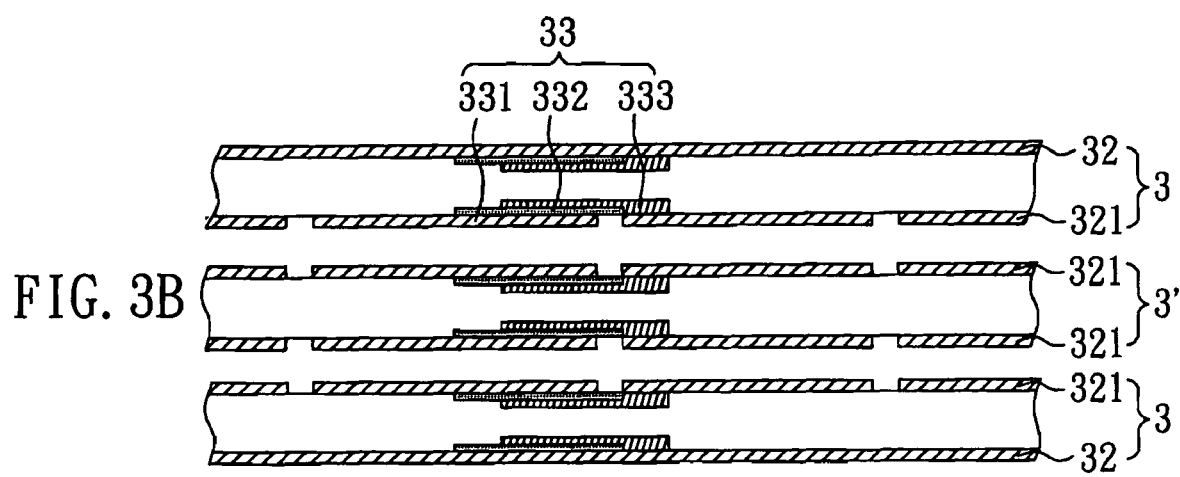

Subsequently, as shown in FIG. 3B, the first metal layer 32 on one surface of each the core layers 3, 3 is patterned to form a circuit layer 321. Likewise the first metal layers 32 on the outsides of the opposite surfaces of the core layer 3' are patterned to individually form a circuit layer 321.

Figure 3C:
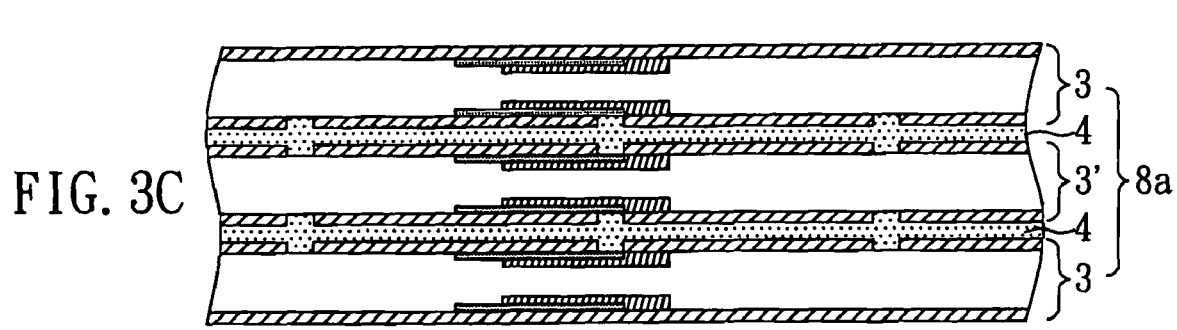

Then, as shown in FIG. 3C, the core layer 3' is sandwiched in and laminated between the core layers 3 and 3 by an adhesive layer 4 to form an unaccomplished core structure 8a. The material of the adhesive layer 4 can be one selected in accordance with the dielectric layer 31.

Figure 3D:
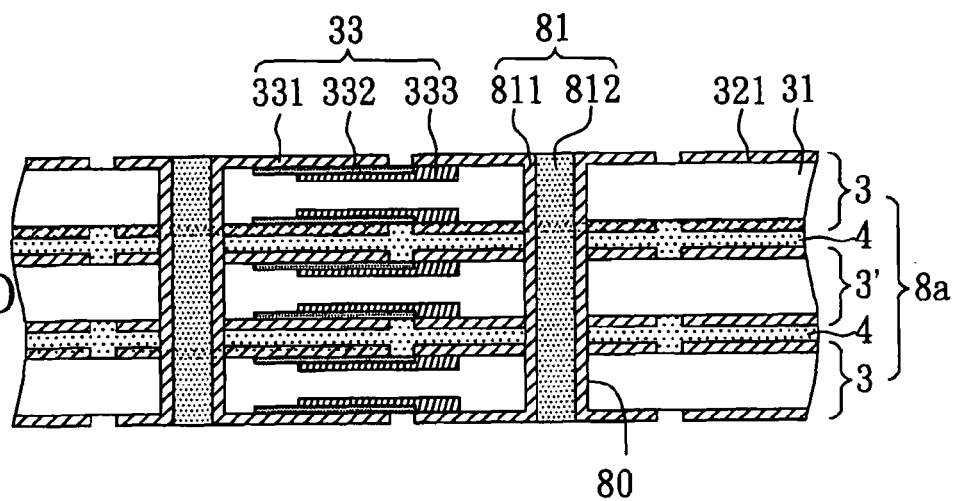

Finally, as shown in FIG. 3D, a through hole 80 is formed in the core structure 8a by machine-drilling or laser-ablation; the first metal layers 32 on the outsides of two opposite surfaces of the core structure 8a are patterned to individually form a circuit layer 321; and a conductive through hole 81 is formed on the wall of the through hole 80. The conductive through hole 81 has a metal layer 811. The metal layer 811 can thoroughly fill the through hole 80 (not shown in FIG. 3D), or the space unfilled with the metal layer 811 in the through hole 80 is filled with an isolating material 812 (as shown in FIG. 3D), such as epoxy resin. The conductive through hole 81 electrically connects the circuit layers 321 on the core layers 3, 3' and 3, and the core structure 8a with capacitors embedded therein of the present invention is accomplished. The method of forming the circuit layers 321 as well as the conductive through hole 81 is well known in the art, thus not to be described further here.

Hereafter, the process for forming capacitors 33 is described in detail. Referring to FIG. 3B, a high dielectric constant material layer 332 is formed on the part surface of the first metal layer 32 by sputtering, coating, or printing before the first metal layer 32 is laminated with the dielectric layer 31. The material of the high dielectric constant material layer 332 is polymeric material, ceramic material, polymeric material filled with ceramic material, or mixture of the like thereof. For example, it could be formed by any one of consisting of barium-tianate, lead-zirconate-tianate, and amorphous hydrogenated carbon dispersing to a binder. Subsequently, a second metal layer comprising a second electrode plate 333 is formed on the surface of the high dielectric constant material layer 332 and also on a part surface of the first metal layer 32 neighboring the high dielectric constant material layer 332, and connects to the first metal layer 32. Finally, the first metal layer 32 is patterned to form the circuit layer 321 and a first electrode plate 331 parallel to the second electrode plate 333 is simultaneously formed after the first metal layer 32 is laminated with the dielectric layer 31. The first electrode plate 331 and the second electrode plate 333 electrically connect to the circuit layer 321, respectively, while the first electrode plate 331 does not electrically connect to the second electrode plate 333.

Figure 3E:
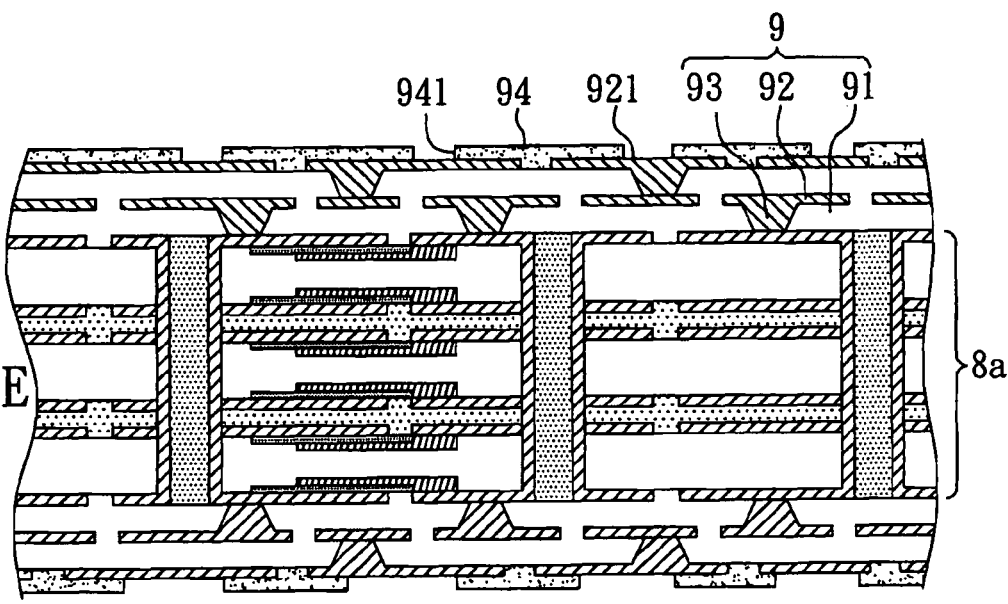

In addition, as shown in FIG. 3E, built-up structures 9 are formed on the two opposite surfaces of the core structure 8a by build-up process. The built-up structures 9 individually comprise at least one dielectric layer 91, at least one circuit layer 92, a plurality of conductive vias 93 and a plurality of conductive pads 921. Then, solder masks 94 are formed on the surfaces of the built-up structures 90. The solder masks 94 have a plurality of openings 941 to expose the conductive pads 921 of the built-up structures 9.

Method Embodiment 2

Figure 4A:
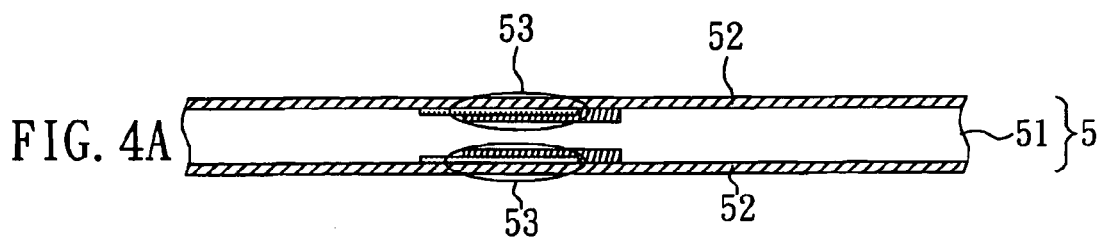
FIGS. 4A to 4F are cross-section views of a process for Method Embodiment 2 of the present invention.

With reference to FIGS. 4A to 4F, there are shown cross-section views of another process for fabricating a circuit board structure with capacitors embedded therein. As shown in FIG. 4A, a first core layer 5 is provided. The first core layer 5 comprises a dielectric layer 51 having two opposite surfaces, first metal layers 52 disposed on the outsides of the two opposite surfaces of the dielectric layer, and at least two capacitors 53 embedded respectively on the insides of the two opposite surfaces of the dielectric layer 51 and individually electrically connecting with the first metal layer 52 at the same side.

Figure 4B:
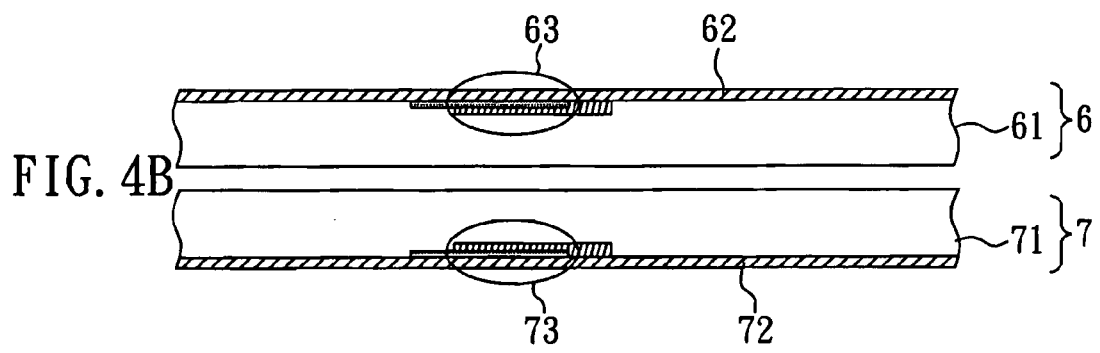

Subsequently, as shown in FIG. 4B, a second core layer 6 and a third core layer 7 are provided. The second core layer 6 and the third core layer 7 individually comprise a dielectric layer 61,71; a first metal layer 62,72 disposed on one surface of the dielectric layer 61,71; and at least one capacitor 61,71 embedded on the inside of the surface with the first metal layer 62,72 disposed on the outside thereof of the dielectric layer 61,71 and electrically connecting with the first metal layer 62,72.

Figure 4C:
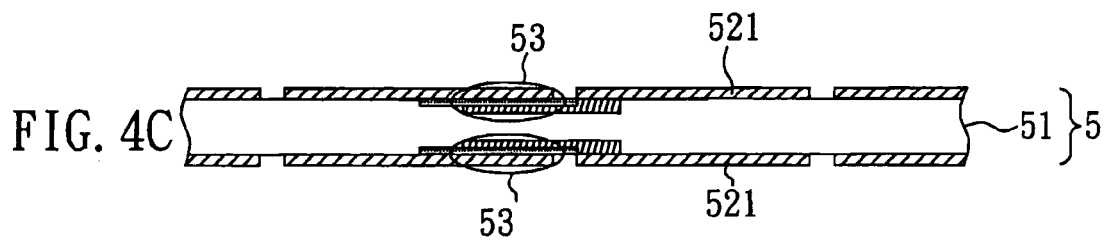

Then, as shown in FIG. 4C, the first metal layers 52 on the two sides of the first core layer 5 are patterned to form circuit layers 521.

Figure 4D:
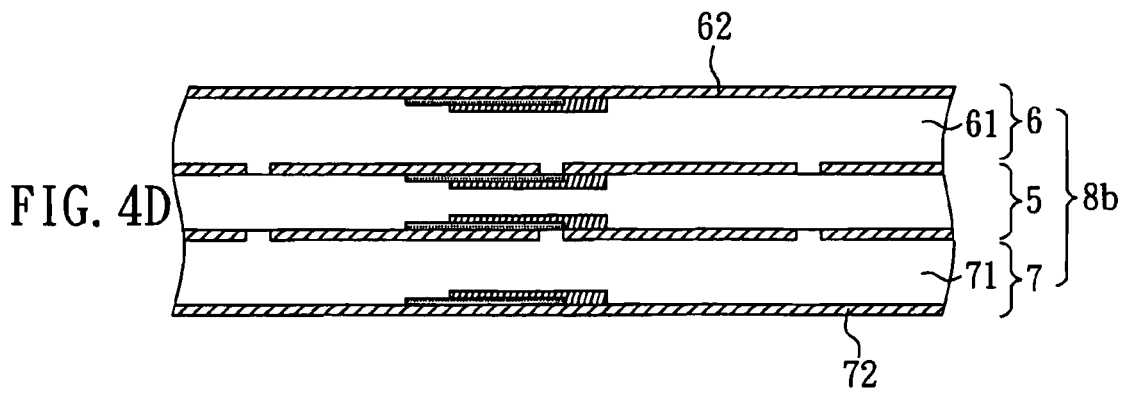

As shown in FIG. 4D, the two surfaces of the first core layer 5 are laminated with the dielectric layers 61,71 of the second core layer 6 and the third core layer 7, respectively, to form an unaccomplished core structure 8b.

Figure 4E:
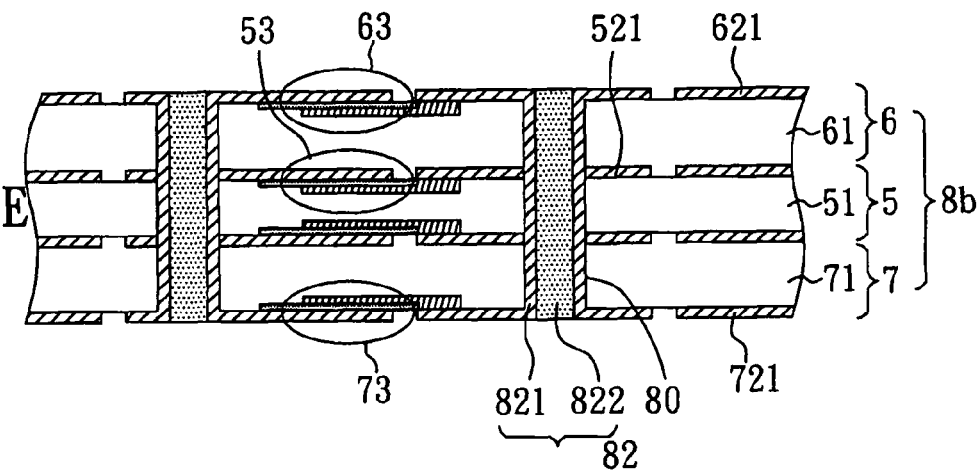

Subsequently, as shown in FIG. 4E, after the core structure 8b is formed, a through hole 80 is formed by machine-drilling or laser-ablation; the first metal layers 62 and 72 of the second core layers 6 and the third core layer 7 are patterned to form circuit layers 621 and 721, respectively; and a first conductive through hole 82 is simultaneously formed on the wall of the through hole 80. The first conductive through hole 82 electrically connects the circuit layers 521, 621 and 721, and the core structure 8b with capacitors embedded therein of the present invention is accomplished.

Figure 4F:
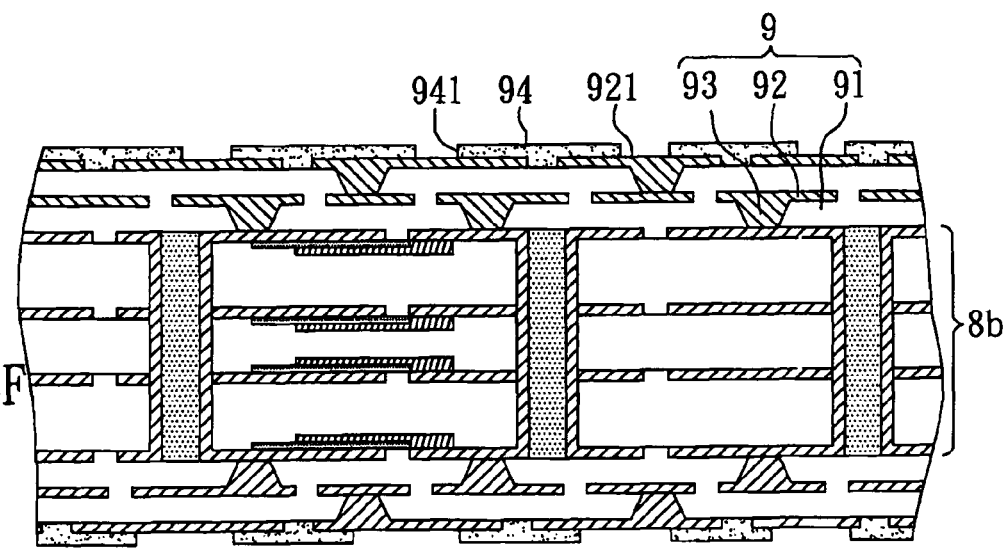

Finally, as shown in FIG. 4F, built-up structures 9 are formed on the two opposite surfaces of the core structure 8b. The process for fabricating the built-up structures 9 is the same as that described in Method Embodiment 1.

The process for fabricating the capacitors 53, 63 and 73 of the first, the second, and the third core layers 5, 6 and 7 of the present embodiment is the same as that described in Method Embodiment 1.

Method Embodiment 3

Figure 5A:
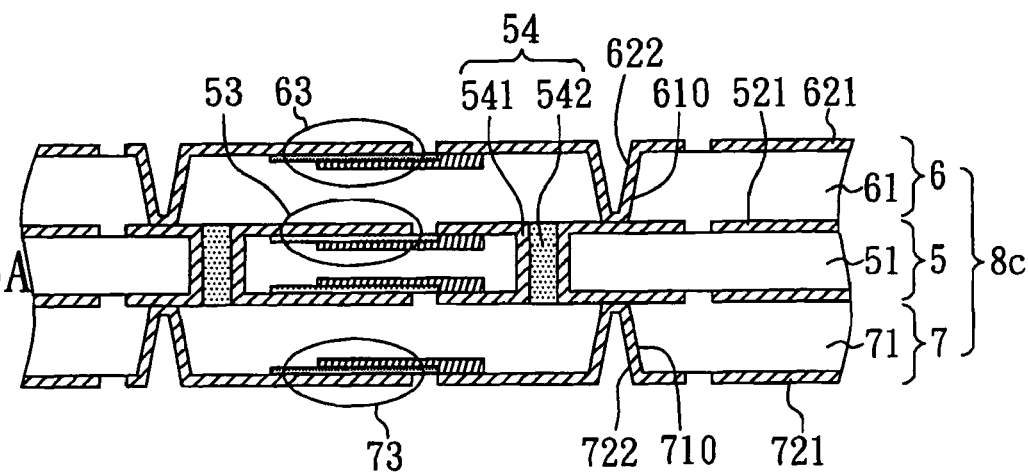
FIGS. 5A to 5B are cross-section views of a process for Method Embodiment 3 of the present invention.

The present embodiment is the same as Method Embodiment 2, except the process for fabricating the components electrically connecting the circuit layers 521, 621 and 721. Please refer to FIG. 5A. In the present embodiment, a second conductive through hole 54 is formed in the first core layer 5, and the second conductive through hole 54 electrically connects the circuit layers 521 on the two sides of the first core layer 5. After the first core layer 5 is laminated between the second core layer 6 and the third core layer 7, a plurality of vias 610 and 710 are formed in the second core layer 6 and the third core layer 7, respectively. Then, the first metal layers of the second core layer 6 and the third core layer 7 are patterned to form circuit layers 621 and 721, respectively, and conductive vias 622 and 722 are simultaneously formed in the vias 610 and 710, respectively. Other steps are the same as those described in Method Embodiment 2. The conductive vias 622 in the second core layer 6 electrically connect the circuit layer 621 of the second core layer 6 with the circuit layer 521 of the first core layer 5. The conductive vias 722 in the third core layer 7 electrically connect the circuit layer 721 of the third core layer 7 with the circuit layer 521 of the first core layer 5. Accordingly, a core structure 8c is accomplished.

Figure 5B:
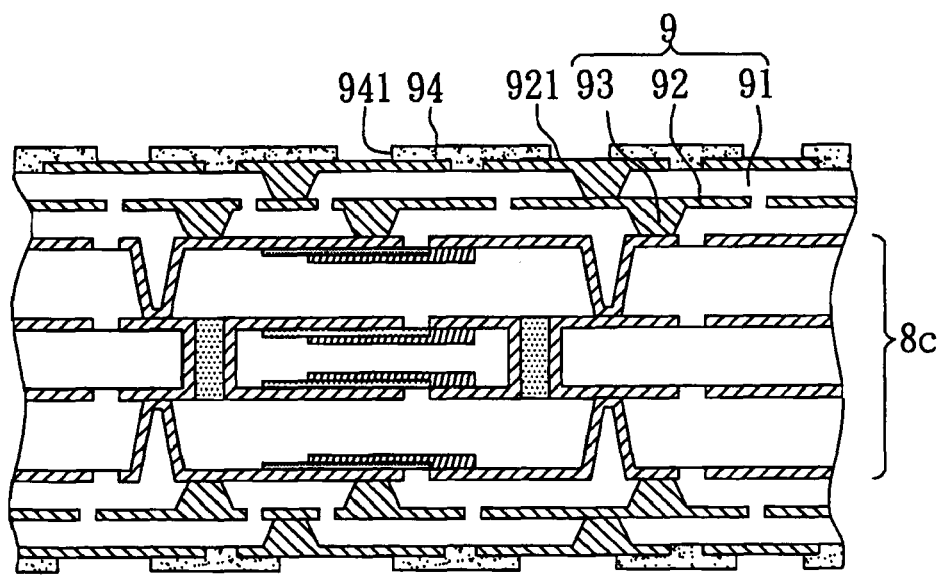

As shown in FIG. 5B, built-up structures 9 are formed on the two opposite surfaces of the core structure 8c. The process for fabricating the built-up structures 9 is the same as that described in Method Embodiment 1.

Structure Example 1

The present invention further provides a circuit board structure with capacitors embedded therein, as shown in FIG. 3D, comprising: at least two core layers 3 and 3 (three core layers 3, 3' and 3 are provided in the present embodiment) individually comprising a dielectric layer 31 having two opposite surfaces, circuit layers 321 disposed on the outsides of the two opposite surfaces of the dielectric layer 31, and at least two capacitors 33 embedded respectively on the insides of the two opposite surfaces of the dielectric layer 31 and individually electrically connecting with the circuit layer 321 at the same side; at least one adhesive layer 4 disposed among the core layers 3, 3' and 3 to combine the core layers 3, 3' and 3 as a core structure 8a; and at least one conductive through hole 81 penetrating the core layers 3, 3' and 3 and the adhesive layer 4, thereby electrically connecting the circuit layers 321 of the core layers 3, 3' and 3.

In addition, as shown in FIG. 3E, built-up structures 9 are disposed on the two opposite surfaces of the core structure 8a. The built-up structures 9 individually comprise at least one dielectric layer 91, at least one circuit layer 92, a plurality of conductive vias 93 and a plurality of conductive pads 921, therewith a solder mask 94 disposed on each of the surfaces of the built-up structures 90, having a plurality of openings 941 to expose the conductive pads 921 of the built-up structures 9.

Structure Example 2

The present invention further provides a circuit board structure with capacitors embedded therein, as shown in FIG. 4E, comprising: a first core layer 5 comprising a dielectric layer 51 having two opposite surfaces, circuit layers 521 disposed on the outsides of the two opposite surfaces of the dielectric layer 51, and at least two capacitors 53 embedded respectively on the insides of the two opposite surfaces of the dielectric layer 51 and individually electrically connecting with the circuit layer 521 at the same side; and a second core layer 6 and a third core layer 7 disposed respectively on the two sides of the first core layer 5 to form a core structure 8b, wherein the second core layer 6 and the third core layer 7 individually comprise a dielectric layer 61,71; a circuit layer 621,721 disposed on the outer surface of the dielectric layer 61,71; and at least one capacitor 63,73 embedded on the inside of the outer surface of the dielectric layer 61,71 and electrically connecting with the circuit layer 621,721.

Herein, the structure of the present embodiment further comprises at least one first conductive through hole 82 penetrating the first, the second, and the third core layers 5,6, and 7 to electrically connect the circuit layers 521, 621, and 721 of the first, the second, and the third core layers 5, 6, and 7.

In addition, as shown in FIG. 4F, built-up structures 9 are disposed on the two opposite surfaces of the core structure 8b. The built-up structures 9 of the present embodiment are the same as that of Structure Example 1.

Structure Example 3

The structure in the present embodiment is the same as that in Structure Example 2, as shown in 5A, except that there is no first conductive through hole penetrating the first, the second, and the third core layers 5, 6, and 7 electrically connecting the circuit layers 521, 621, and 721 in the present embodiment. In the present embodiment, the two circuit layers 521 of the first core layer 5 electrically connect to each other by at least one second conductive through hole 54 penetrating the first core layer 5. In addition, the circuit layers 621 and 721 of the second core layer 6 and the third core layer 7 can electrically connect to the circuit layers 521 on the two sides of the first core layer 5 by a plurality of conductive vias 622 and 722 disposed in the second core layer 6 and the third core layer 7, respectively.

In addition, as shown in FIG. 5B, built-up structures 9 are formed on the two opposite surfaces of the core structure 8c. The built-up structures 9 of the present embodiment are the same as that of Structure Example 1.

In summary, the present invention is characterized by that a plurality of core layers individually comprising capacitors embedded on the inside of at least one surface thereof are provided; the core layers are stacked and laminated to form a core structure; and the circuit layers of the core structure electrically connect to each other by conductive through holes or conductive vias. Accordingly, the present invention can improve the flexibility of circuit layout, realize parallel connection between the capacitors to provide more capacitance, efficiently enhance the utilization ratio of inner space of the circuit board, and thereby achieve the purpose of miniaturization.

Although the present invention has been explained in relation to its preferred embodiment, it is to be understood that many other possible modifications and variations can be made without departing from the spirit and scope of the invention as hereinafter claimed.

What is claimed is:

1. A method for fabricating a circuit board structure with capacitors embedded therein, comprising:
   providing a first core layer comprising a dielectric layer having two opposite surfaces, first metal layers disposed on the outsides of the two opposite surfaces of the dielectric layer, and at least two capacitors embedded respectively on the insides of the two opposite surfaces of the dielectric layer and individually electrically connecting with the first metal layer at the same side;

providing a second core layer and a third core layer individually comprising a dielectric layer having a first surface and a second surface opposite to the first surface, a first metal layer disposed on the first surface of the dielectric layer, and at least one capacitor embedded on the inside of the first surface with the first metal layer disposed on the outside thereof of the dielectric layer and electrically connecting with the first metal layer;

patterning the two first metal layers of the first core layer to form circuit layers;

laminating the two surfaces of the first core layer with the second surfaces of the dielectric layers of the second core layer and the third core layer, respectively, to form a core structure, wherein the second surfaces of the dielectric layers have no capacitors and metal layers respectively on the inside and the outside thereof; and patterning the first metal layers of the second core layer and the third core layer to form circuit layers;

wherein each of the capacitors comprises: a first electrode plate disposed on the outside of one surface of the dielectric layer, and electrically connecting with the circuit layer at the same side; a high dielectric constant material layer embedded on the inside of the surface with the first electrode plate disposed on the outside thereof of the dielectric layer, and plastering the first electrode plate; and a second electrode plate disposed in the inner space of the dielectric layer, plastered with the high dielectric constant material layer, parallel with the first electrode plate, and electrically connecting to the circuit layer but not electrically connecting to the first electrode plate through the circuit layer.

2. The method as claimed in claim 1, further comprising: forming a first conductive through hole penetrating the first, the second, and the third core layers to electrically connect the circuit layers of the first, the second, and the third core layers, while forming the circuit layers of the second core layer and the third core layer.

3. The method as claimed in claim 1, further comprising: forming a second conductive through hole penetrating the first core layer to electrically connect the circuit layers on the two sides of the first core layer, while forming the circuit layers of the first core layer; and forming a plurality of conductive vias in the dielectric layers of the second, and third core layers to electrically connect the circuit layers of the second core layer and the third core layer with the circuit layers on the two sides of the first core layer, respectively, while forming the circuit layers of the second core layer and the third core layer.

4. The method as claimed in claim 1, further comprising: forming built-up structures on the two sides of the core structure, wherein the built-up structures individually comprise at least one dielectric layer, at least one circuit layer, a plurality of conductive vias, and a plurality of conductive pads; parts of the conductive pads electrically connect to the second, and third core layers, respectively; and the built-up structures further individually comprise a solder mask having a plurality of openings to expose the conductive pads.

5. The method as claimed in claim 1, wherein all of the capacitors are aligned with one another in the thickness direction.

\* \* \* \* \*